(12) United States Patent
Maruyama et al.

(10) Patent No.: US 9,373,528 B2
(45) Date of Patent: Jun. 21, 2016

(54) SUBSTRATE PROCESSING APPARATUS

(71) Applicant: EBARA CORPORATION, Tokyo (JP)

(72) Inventors: Toru Maruyama, Tokyo (JP);
Mitsunori Komatsu, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 14/286,139

(22) Filed: May 23, 2014

(65) Prior Publication Data
US 2014/0345658 A1 Nov. 27, 2014

(30) Foreign Application Priority Data
May 24, 2013 (JP) .................................. 2013-109865

(51) Int. Cl.
*H01L 21/67* (2006.01)
(52) U.S. Cl.
CPC .... *H01L 21/67017* (2013.01); *H01L 21/67051* (2013.01); *H01L 21/67253* (2013.01)
(58) Field of Classification Search
CPC ................................................ H01L 21/67017
See application file for complete search history.

(56) References Cited

U.S. PATENT DOCUMENTS

| 8,425,686 | B2 * | 4/2013 | Matsumoto ...................... 134/18 |
| 2012/0074102 | A1 * | 3/2012 | Magara et al. .................. 216/83 |

FOREIGN PATENT DOCUMENTS

| JP | 2001-269868 A | 10/2001 |
| JP | 2003-253453 A | 9/2003 |
| JP | 2005-079216 A | 3/2005 |
| JP | 2011-199256 A | 10/2011 |

* cited by examiner

*Primary Examiner* — Jason Ko
(74) *Attorney, Agent, or Firm* — Pearne & Gordon LLP

(57) ABSTRACT

A substrate processing apparatus 1 includes a substrate processing unit 40 configured to process a substrate W by supplying a mixed liquid M of a first liquid C and a second liquid D to the substrate W, a first flow rate regulator 10 disposed in a first supply pipe 31 configured to allow the first liquid C to flow therethrough, and the first flow rate regulator 10 configured to measure a flow rate by a differential pressure and to regulate the flow rate, a second flow rate regulator 20 disposed in a second supply pipe 32 configured to allow the second liquid D to flow therethrough, and the second flow rate regulator 20 configured to measure a flow rate by a differential pressure and to regulate the flow rate, a concentration meter 51 disposed in a mixed liquid pipe 33 configured to guide the mixed liquid M with a mixture of the first liquid C having passed through the first flow rate regulator 10 and the second liquid D having passed through the second flow rate regulator 20 to the substrate processing unit 40, and a controller 60 configured to take difference elimination measures when the difference between a conforming concentration as the concentration of the mixed liquid M suitable for processing the substrate W in the substrate processing unit 40 and the concentration measured with the concentration meter 51 exceeds a predetermined value. With this, even if zero-point deviation of a differential pressure flowmeter occurs, it is possible to eliminate the difference in concentration.

10 Claims, 3 Drawing Sheets

SUBSTRATE PROCESSING APPARATUS

TECHNICAL FIELD

The present invention relates to a substrate processing apparatus, and in particular, to a substrate processing apparatus capable of eliminating a difference in concentration even if zero-point deviation of a differential pressure flowmeter occurs.

BACKGROUND ART

In general, a substrate, such as a semiconductor wafer, is subjected to cleaning processing after copper plating processing or CMP (chemical-mechanical polishing) processing on the surface of the substrate. A cleaning device which performs the cleaning processing usually rotates the substrate while holding the substrate horizontally by a rotation holding device and supplies a cleaning liquid to the rotating substrate to perform substrate cleaning (for example, Patent Document 1).

PRIOR ART DOCUMENT

Patent Document

[Patent document 1] JP-A-2005-079216 (paragraph 0020, FIG. 1, and the like)

SUMMARY OF THE INVENTION

Problem to be Solved by the Invention

As the cleaning liquid, a chemical of a type and with concentration suitable for cleaning conditions is used. The concentration of the chemical can be regulated by regulating the flow rate of pure water with respect to the chemical at a predetermined flow rate. The flow rate of each of the chemical and the pure water can be accurately regulated by a flow rate controller having a differential pressure flowmeter in the line of each fluid. However, when zero-point deviation occurs in the differential pressure flowmeter of the flow rate controller, the display of the differential pressure flowmeter shows a normal value, and thus, a state where drift occurs between the measured flow rate and the displayed flow rate is continued without outputting an error. In this case, there is a concern that the concentration of the chemical does not conform to the cleaning conditions and affects processing performance.

In view of the above-described problem, it is an object of the invention to provide a substrate processing apparatus capable of eliminating a difference in concentration even if zero-point deviation of a differential pressure flowmeter occurs.

Means for Solving the Problem

To achieve the above object, a substrate processing apparatus according to the first aspect of the present invention includes, as shown in FIG. 1, for example, a substrate processing unit 40 configured to process a substrate W by supplying a mixed liquid M to the substrate W, the mixed liquid M being a liquid with a mixture of a first liquid C and a second liquid D, the second liquid D being of a type different from the first liquid C; a first supply pipe 31 configured to allow the first liquid C to flow therethrough; a first flow rate regulator 10 disposed in the first supply pipe 31, the first flow rate regulator 10 having a first flow rate measurement unit 11 and a first flow rate regulation unit 12, the first flow rate measurement unit 11 being configured to measure a flow rate of the first liquid C by a differential pressure, the first flow rate regulation unit 12 being configured to regulate the flow rate of the first liquid C; a second supply pipe 32 configured to allow the second liquid D to flow therethrough; a second flow rate regulator 20 disposed in the second supply pipe 32, the second flow rate regulator 20 having a second flow rate measurement unit 21 and a second flow rate regulation unit 22, the second flow rate measurement unit 21 being configured to measure a flow rate of the second liquid D by a differential pressure, the second flow rate regulation unit 22 being configured to regulate the flow rate of the second liquid D; a mixed liquid pipe 33 configured to guide the mixed liquid M to the substrate processing unit 40, the mixed liquid M being a liquid with a mixture of the first liquid C having passed through the first flow rate regulator 10 and the second liquid D having passed through the second flow rate regulator 20; a concentration meter 51 disposed in the mixed liquid pipe 33, the concentration meter 51 being configured to measure a concentration of the first liquid C in the mixed liquid M; and a controller 60 configured to take difference elimination measures when the difference between a conforming concentration and a concentration measured with the concentration meter 51 exceeds a predetermined value, the conforming concentration being a concentration of the mixed liquid M suitable for processing the substrate W in the substrate processing unit 40.

According to this configuration, even if zero-point deviation of the first flow rate measurement unit and/or the second flow rate measurement unit configured to measure the flow rate of the fluid by the differential pressure occurs, it is possible to eliminate the difference in concentration while continuing to supply the mixed liquid to the substrate processing unit.

As for the substrate processing apparatus according to the second aspect of the present invention, as shown in FIG. 1, for example, in the substrate processing apparatus 1 according to the first aspect, the substrate processing apparatus 1 further includes a flowmeter 52 disposed in the mixed liquid pipe 33, the flowmeter 52 being configured to measure a flow rate of the mixed liquid M, in the substrate processing apparatus 1, the controller 60 regulates the flow rate of the first liquid C passing through the first flow rate regulator 10 and the flow rate of the second liquid D passing through the second flow rate regulator 20 such that the flow rate of the mixed liquid M measured with the flowmeter 52 becomes a flow rate suitable for processing the substrate W in the substrate processing unit 40.

According to this configuration, it is possible to appropriately correct the flow rate of the mixed liquid as well as the concentration of the mixed liquid while supplying the mixed liquid to the substrate processing unit.

According to the above configuration, even if zero-point deviation of the first flow rate measurement unit and/or the second flow rate measurement unit configured to measure the flow rate of the fluid by the differential pressure occurs, it is possible to eliminate the difference in concentration while continuing to supply the mixed liquid to the substrate processing unit.

BEST MODE FOR CARRYING OUT THE INVENTION

Figure 1:
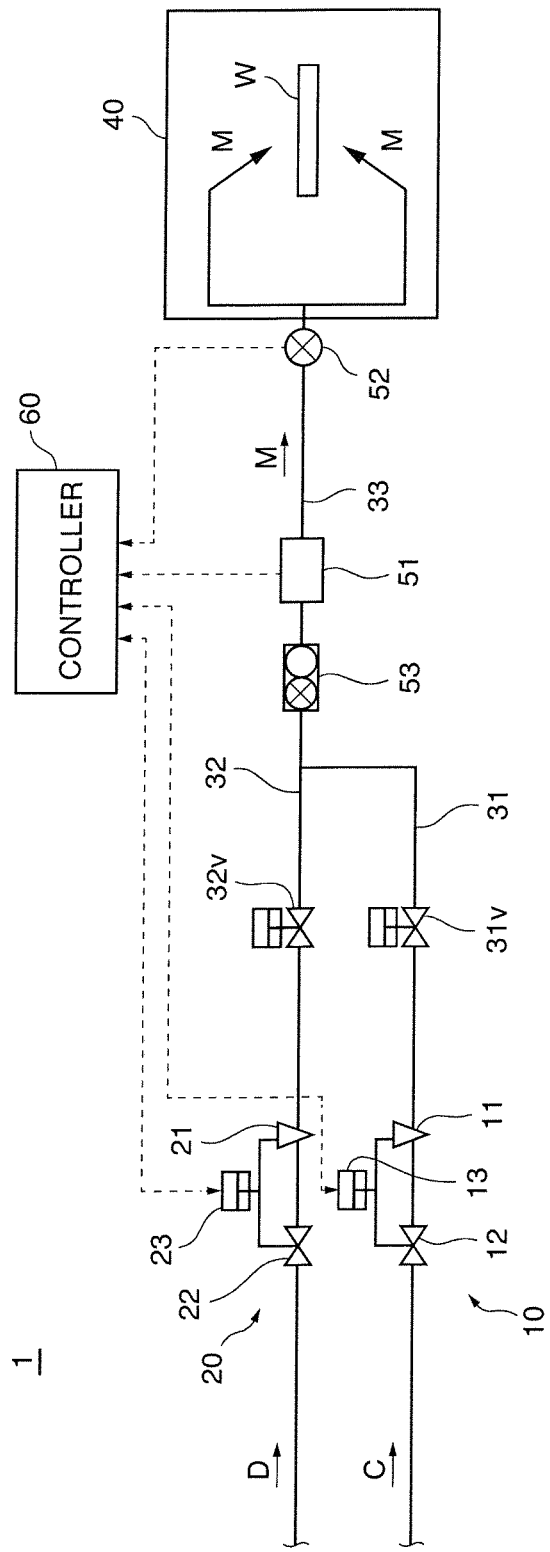
FIG. 1 is a schematic system diagram of a substrate processing apparatus according to an embodiment of the present invention.

This application is based on the Patent Application No. 2013-109865 filed on May 24, 2013 in Japan, the contents of which are hereby incorporated in its entirety by reference into the present application, as part thereof.

The present invention will become more fully understood from the detailed description given hereinbelow. Further range of application of the present invention will become clearer from the detailed description given hereinbelow. However, the detailed description and the specific embodiment are illustrated of desired embodiments of the present invention and are described only for the purpose of explanation. Various changes and modifications will be apparent to those ordinary skilled in the art on the basis of the detailed description.

The applicant has no intention to give to public any disclosed embodiment. Among the disclosed changes and modifications, those which may not literally fall within the scope of the patent claims constitute, therefore, a part of the present invention in the sense of doctrine of equivalents.

Description will hereinafter be made of an embodiment of the present invention with reference to the drawings. The same or corresponding members are denoted with the same reference numerals in all the drawings, and their descriptions are not repeated.

First, referring to FIG. 1, a substrate processing apparatus 1 according to an embodiment of the present invention will be described. FIG. 1 is a schematic system diagram of the substrate processing apparatus 1. The substrate processing apparatus 1 includes a chemical supply pipe 31 as a first supply pipe configured to allow a chemical C as a first liquid to flow therethrough, a chemical flow rate controller 10 as a first flow rate regulator disposed in the chemical supply pipe 31, a pure water supply pipe 32 as a second supply pipe configured to allow pure water D as a second liquid to flow therethrough, a pure water flow rate controller 20 as a second flow rate regulator disposed in the pure water supply pipe 32, a mixed liquid pipe 33 configured to allow a mixed liquid M as a mixed liquid of the chemical C and the pure water D to flow therethrough, a mixed liquid concentration meter 51 configured to measure the concentration of the mixed liquid M, a mixed liquid flowmeter 52 configured to measure the flow rate of the mixed liquid M, a cleaning machine 40 as a substrate processing unit configured to perform cleaning processing on the substrate W, and a controller 60.

The substrate W to be processed in this embodiment is typically a circular substrate with a silicon dioxide film in which a groove according to a wiring pattern is formed on the surface thereof. For example, various films, such as a titanium nitride film or a tantalum nitride film as a barrier metal on the silicon dioxide film and a tungsten film or a copper film on the titanium nitride film or the tantalum nitride film, are formed. As the chemical C, a chemical suitable for cleaning the substrate W to be processed, such as ammonia hydrogen peroxide water, is used. Pure water D is also referred to as deionized water (DIW).

The chemical flow rate controller 10 is a device configured to control the flow rate of the chemical C flowing through the chemical supply pipe 31 to a set value. The chemical flow rate controller 10 has a chemical differential pressure flowmeter 11 as a first flow rate measurement unit, a chemical flow rate regulation valve 12 as a first flow rate regulation unit, and a chemical control unit 13. The chemical differential pressure flowmeter 11 has an orifice (not shown), an upstream pressure sensor (not shown) configured to detect the upstream-side pressure of the orifice, and a downstream pressure sensor (not shown) configured to detect the downstream-side pressure of the orifice. In this embodiment, both the upstream pressure sensor and the downstream pressure sensor are sensors which detect a pressure in a diaphragm manner. The chemical differential pressure flowmeter 11 having this configuration rarely fails because of a small number of moving parts, undergoes a comparatively small pressure loss, has a simple structure, and is easily available. The chemical differential pressure flowmeter 11 is configured by inputting in advance the density of a fluid to be handled and to output a mass flow rate. The chemical flow rate regulation valve 12 has an actuator (not shown) and is configured to regulate the opening in response to a signal from the chemical control unit 13. The chemical control unit 13 is a part configured to receive information regarding the flow rate measured by the chemical differential pressure flowmeter 11 and to regulate the opening of the chemical flow rate regulation valve 12 such that the measured flow rate becomes a set value. The chemical control unit 13 has a display unit (not shown) configured to display the flow rate measured by the chemical differential pressure flowmeter 11 and a set flow rate (flow rate set value).

The pure water flow rate controller 20 is a device configured to control the flow rate of the pure water D flowing through the pure water supply pipe 32 to the set value. The pure water flow rate controller 20 has a pure water differential pressure flowmeter 21 as a second flow rate measurement unit, a pure water flow rate regulation valve 22 as a second flow rate regulation unit, and a pure water control unit 23. The pure water flow rate controller 20 has the same configuration as the chemical flow rate controller 10, and the pure water differential pressure flowmeter 21, the pure water flow rate regulation valve 22, and the pure water control unit 23 correspond to the chemical differential pressure flowmeter 11, the chemical flow rate regulation valve 12, and the chemical control unit 13 respectively in the chemical flow rate controller 10. In the following description, as the general term for referring to the common property of the chemical flow rate controller 10 and the pure water flow rate controller 20, both are simply referred to as "flow rate controllers 10 and 20". The chemical differential pressure flowmeter 11 and the pure water differential pressure flowmeter 21 may be simply referred to as "differential pressure flowmeters 11 and 21".

The chemical supply pipe 31 and the pure water supply pipe 32 have one end, respectively, connected to one end of the mixed liquid pipe 33, and are configured to join and guide the chemical C which has flowed through the chemical supply pipe 31 and the pure water D which has flowed through the pure water supply pipe 32 to the mixed liquid pipe 33. The other end of the mixed liquid pipe 33 is connected to the cleaning machine 40. The chemical supply pipe 31 is provided with a chemical supply valve 31v configured to be able to block the flow of the chemical C between a connection part to the mixed liquid pipe 33 and the chemical flow rate controller 10. The pure water supply pipe 32 is provided with a pure water supply valve 32v configured to be able to block the flow of the pure water D between a connection part to the mixed liquid pipe 33 and the pure water flow rate controller 20. The mixed liquid pipe 33 is provided with a mixer 53 configured to further uniformize the state of mixing of the chemical C and the pure water D, and the mixed liquid concentration meter 51 and the mixed liquid flowmeter 52 described above.

The mixed liquid concentration meter 51 is a device which measures the concentration of the chemical C in the mixed liquid M. Since the chemical differential pressure flowmeter 11 of the chemical flow rate controller 10 and the pure water differential pressure flowmeter 21 of the pure water flow rate controller 20 output the mass flow rates, as the mixed liquid concentration meter 51, a meter configured to measure mass concentration is used. Typically, it should suffice that the mixed liquid concentration meter 51 can know the ratio of the chemical C and the pure water D in the mixed liquid M, and a meter configured to measure pH of the mixed liquid M or a meter configured to measure conductivity of the mixed liquid M may be used depending on the type of the mixed liquid M.

The mixed liquid flowmeter 52 is a device which measures the flow rate of the mixed liquid M. As the mixed liquid flowmeter 52, a flowmeter configured to measure a mass flow rate with high precision is preferably used, and in this embodiment, a Coriolis flowmeter is used. In this embodiment, a Coriolis flowmeter (mixed liquid flowmeter 52) is disposed in the mixed liquid pipe 33, whereby the number of Coriolis flowmeters is reduced and an increase in pressure loss and an increase in cost are suppressed compared to a case where flowmeters are respectively provided in the chemical supply pipe 31 and the pure water supply pipe 32.

The cleaning machine 40 is a device configured to perform the cleaning of the substrate W subjected to copper plating processing or CMP processing in the preceding process (not shown). Accordingly, the processing of the substrate W here is cleaning. That is, cleaning is one of the processing. Though details are not shown, typically, the cleaning machine 40 is configured to remove particles on the substrate W by rubbing the substrate W with a cleaning member, such as a roll sponge or a pencil-type sponge, while rotating the substrate W held by a roller chuck or a spin chuck within a horizontal plane. In the cleaning machine 40, when cleaning the substrate W with the cleaning member, the mixed liquid M passing through the mixed liquid concentration meter 51 and the mixed liquid flowmeter 52 is supplied to the substrate W, and the mixed liquid M is supplied, thereby improving the cleaning level of the substrate W. When performing the cleaning of the substrate W, since there is a ratio of the chemical C in the mixed liquid M suitable for cleaning the substrate W (this is referred to as "conforming concentration"), pure water W is appropriately mixed with the chemical C, thereby supplying the mixed liquid M with conforming concentration to the substrate W. In the cleaning of the substrate W, while there is a minimum flow rate of the mixed liquid M required, in terms of avoiding wasteful consumption of the mixed liquid M, it is preferable to avoid the supply of the mixed liquid M at an excessive flow rate, and the flow rate of the mixed liquid M suitable for cleaning the substrate W is referred to as "conforming flow rate". When cleaning the substrate W, the conforming flow rate may be different for every cleaning processing. On the other hand, during single cleaning processing, if the flow rate of the mixed liquid M is constant, cleaning performance is stable, and thus, it may be preferable to make the conforming flow rate constant.

The controller 60 is connected to the chemical flow rate controller 10 by a signal cable, and is configured to receive the flow rate measured by the chemical differential pressure flowmeter 11 as a signal through the chemical control unit 13 and to transmit a signal for changing the flow rate set value to the chemical control unit 13. The controller 60 is connected to the pure water flow rate controller 20 by a signal cable, and is configured to receive the flow rate measured by the pure water differential pressure flowmeter 21 as a signal through the pure water control unit 23 and to transmit a signal for changing the flow rate set value to the pure water control unit 23. The controller 60 is connected to the mixed liquid concentration meter 51 by a signal cable, and is configured to receive the concentration measured by the mixed liquid concentration meter 51 (this is referred to as "measured concentration") as a signal. The controller 60 is connected to the mixed liquid flowmeter 52 by a signal cable, and is configured to receive the flow rate measured by the mixed liquid flowmeter 52 (this is referred to as "measured flow rate") as a signal. The controller 60 is configured to calculate the flow rate of each of the chemical C and the pure water D in the mixed liquid M from information regarding the received measured concentration and the measured flow rate. The controller 60 is connected to an alarm (not shown) by a signal cable, and is configured to operate the alarm when a predetermined condition is satisfied.

Continuously, with reference to FIG. 1, an operation of the substrate processing apparatus 1 will be described. Prior to the operation of the substrate processing apparatus 1, the controller 60 calculates the flow rate set value of the chemical flow rate controller 10 and the flow rate set value of the pure water flow rate controller 20 such that the mixed liquid M has the conforming concentration and the conforming flow rate, and respectively transmits the calculated values to the chemical control unit 13 and the pure water control unit 23. The chemical supply valve 31v and the pure water supply valve 32v are opened. Then, the substrate processing apparatus 1 is supplied with the chemical C and the pure water D from the outside. The supplied chemical C flows through the chemical supply pipe 31, is regulated to the flow rate set in the chemical flow rate controller 10, and flows into the mixed liquid pipe 33. On the other hand, the supplied pure water D flows through the pure water supply pipe 32, is regulated to the flow rate set in the pure water flow rate controller 20, and flows into the mixed liquid pipe 33. The chemical C and the pure water D which are regulated to the set flow rates and flow into the mixed liquid pipe 33 are mixed uniformly by the mixer 53 to become the mixed liquid M, and the mixed liquid M is supplied to the cleaning machine 40 and used for the cleaning of the substrate W. While the mixed liquid M flows from the mixer 53 to the cleaning machine 40, the concentration of the mixed liquid M is measured by the mixed liquid concentration meter 51, the flow rate of the mixed liquid M is measured by the mixed liquid flowmeter 52, and the measured concentration and the measured flow rate are transmitted to the controller 60.

In the substrate processing apparatus 1 which acts as described above, since the flow rate of the chemical C is regulated to the set value by the chemical flow rate controller 10, and the flow rate of the pure water D is regulated to the set value by the pure water flow rate controller 20, usually, the mixed liquid M with the conforming concentration and the conforming flow rate is supplied to the cleaning machine 40. However, the chemical differential pressure flowmeter 11 constituting the chemical flow rate controller 10 and/or the pure water differential pressure flowmeter 21 constituting the pure water flow rate controller 20 may undergo zero-point deviation due to slight deformation of the diaphragm. If the drift amount differs between the upstream pressure sensor (not shown) and the downstream pressure sensor (not shown) constituting each of the differential pressure flowmeters 11 and 21, a differential pressure to be detected for an actual flow rate changes, and deviation occurs between the flow rate displayed on (recognized by) each of the flow rate controllers 10 and 20 and the actual flow rate. Then, the concentration and flow rate of the mixed liquid M are likely to be not the conforming concentration and the conforming flow rate, and this may adversely affect cleaning in the cleaning machine 40. In this embodiment, in order to avoid this kind of trouble, the following measures are applied.

Figure 2:
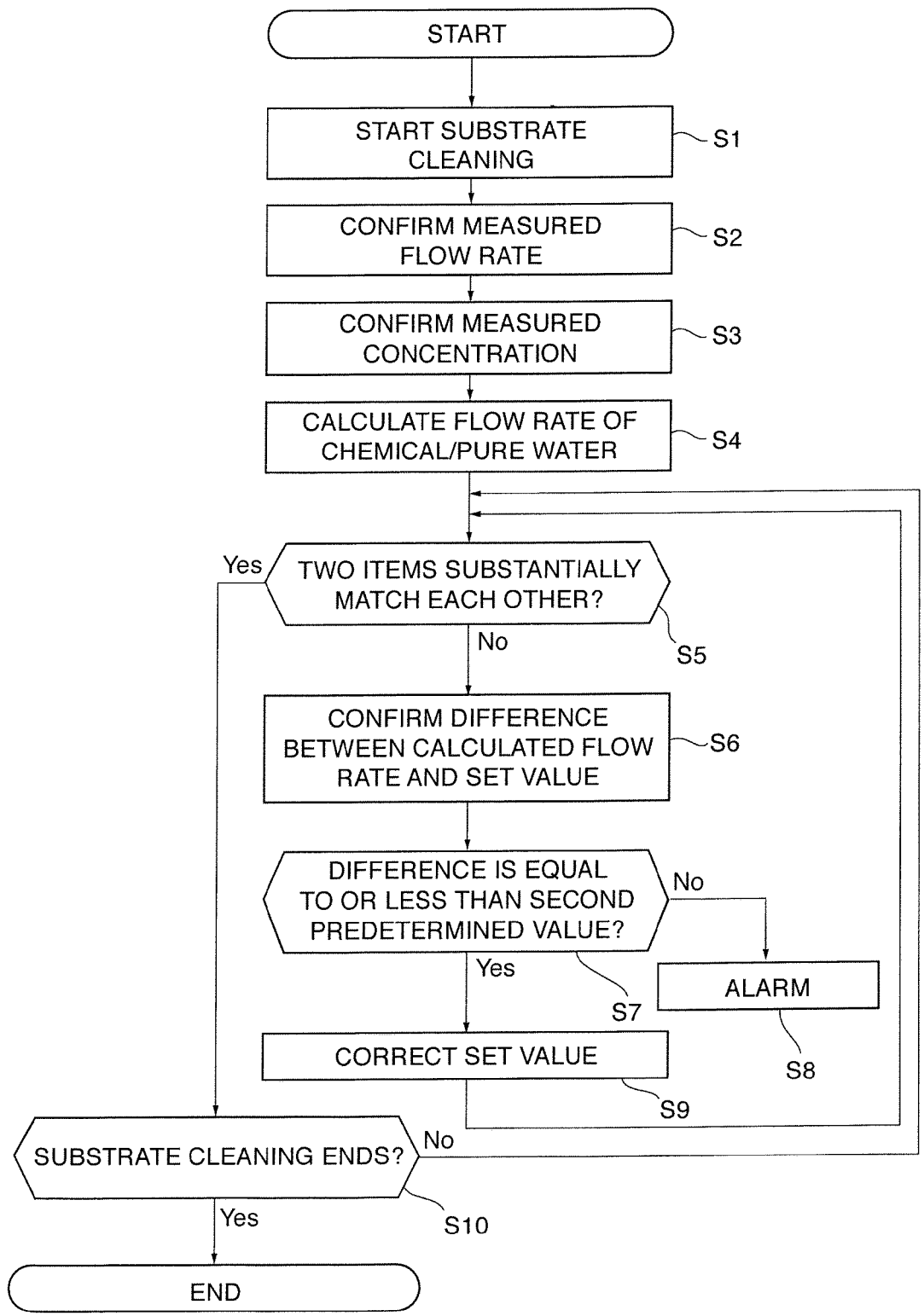
FIG. 2 is a flowchart showing control of the concentration and flow rate of a mixed liquid in the substrate processing apparatus according to the embodiment of the present invention.

FIG. 2 is a flowchart showing control of the concentration and flow rate of the mixed liquid M in the substrate processing apparatus 1. In the following description, when referring to the configuration of the substrate processing apparatus 1, FIG. 1 is to be appropriately referred to. As described above, when the chemical C and the pure water D are supplied to the substrate processing apparatus 1, the mixed liquid M is generated, and the cleaning of the substrate W in the cleaning machine 40 starts (S1). When the mixed liquid M is supplied to the cleaning machine 40, the controller 60 receives the signal of the measured flow rate from the mixed liquid flowmeter 52 (S2). The controller 60 also receives the signal of the measured concentration from the mixed liquid concentration meter 51 (S3). In FIG. 2, for convenience, although the step of obtaining the measured concentration from the mixed liquid concentration meter 51 (S3) is performed next to the step of obtaining the measured flow rate from the mixed liquid flowmeter 52 (S2), actually, both steps (S2 and S3) are performed simultaneously as needed.

Next, the controller 60 calculates the flow rate of the chemical C and the flow rate of the pure water D in the mixed liquid M, the flow rate and the concentration of the mixed liquid M are measured, from the measured flow rate and the measured concentration received as the signals (S4). Here, the calculated flow rate of the chemical C is referred to as "calculated chemical flow rate", and the calculated flow rate of the pure water D is referred to as "calculated pure water flow rate". Next, the controller 60 compares the received measured concentration with the conforming concentration, and compares the received measured flow rate with the conforming flow rate, thereby performing determination about whether or not both substantially match each other (S5). Here, the term "substantially match each other" means that, even if the compared values do not perfectly match each other, when deviation is within an allowable range, both are deemed to match each other. In this embodiment, when deviation between the compared values is equal to or less than a first predetermined value which does not adversely affect the cleaning of the substrate W in the cleaning machine 40, both are deemed to substantially match each other.

In the step of performing determination about whether or not the compared two items substantially match each other (S5), when the two items do not match each other, the controller 60 confirms the difference between the calculated chemical flow rate and the flow rate set value of the chemical flow rate controller 10 and the difference between the calculated pure water flow rate and the flow rate set value of the pure water flow rate controller 20 (S6). Next, the controller 60 performs determination about whether or not each difference between the calculated flow rate and the flow rate set value is equal to or less than a second predetermined value (S7). The second predetermined value is an upper limit value which is appropriately determined within a range capable of being handled by correction described below, and may be determined to, for example, 10% of the flow rate set value. In the step of performing determination about whether or not each difference between the calculated flow rate and the flow rate set value is equal to or less than the second predetermined value (S7), when at least one difference exceeds the second predetermined value, the alarm is operated to attract attention (S8). The attention attraction allows the cleaning of the substrate W in the cleaning machine 40 to be stopped promptly. Since the operation of the alarm leads to the execution of maintenance, the difference between the calculated flow rate and the flow rate set value can be eliminated by maintenance, the operation of the alarm is one of the difference elimination measures.

On the other hand, in the step of performing determination about whether or not each difference between the calculated flow rate and the flow rate set value is equal to or less than the second predetermined value (S7), when both differences are equal to or less than the second predetermined value, the controller 60 corrects the flow rate set value by the difference between the calculated flow rate and the flow rate set value for each of the chemical C and the pure water D (S9). The correction is performed such that, when the calculated chemical flow rate is greater than the flow rate set value of the chemical flow rate controller 10, the flow rate set value is decreased by the difference, and conversely, when the calculated chemical flow rate is less than the flow rate set value of the chemical flow rate controller 10, the flow rate set value is increased by the difference. The same applies to when there is the difference between the calculated pure water flow rate and the flow rate set value of the pure water flow rate controller 20. With this correction, even when zero-point deviation occurs in the chemical differential pressure flowmeter 11 and/or the pure water differential pressure flowmeter 21, it is possible to appropriately regulate the flow rate in each of the flow rate controllers 10 and 20 while supplying the mixed liquid M to the cleaning machine 40. The flow rate in each of the flow rate controllers 10 and 20 is appropriately regulated regardless of the flow rate display in each of the flow rate controllers 10 and 20 (even if the flow rate display is deviated from the set value), whereby the mixed liquid M which is supplied to the cleaning machine 40 has the conforming concentration and the conforming flow rate. In this way, the correction (S9) is one of the difference elimination measures.

After the flow rate set value is corrected (S9), the process returns again to the step of performing determination about whether or not both the compared two items substantially match each other (S5). In the step of performing determination about whether or not both the compared two items substantially match each other (S5), when both substantially match each other respectively, determination about whether or not the cleaning of the substrate W ends is performed (S10). When the cleaning of the substrate W does not end, the process returns to the step of performing determination about whether or not both the compared two items substantially match each other (S5). In this way, the concentration and flow rate of the mixed liquid M will be maintained to the values suitable for cleaning until the cleaning of the substrate W ends. On the other hand, in the step of performing determination about whether or not the cleaning of the substrate W ends (S10), when the cleaning of the substrate W ends, the supply of the chemical C and the pure water D to the substrate processing apparatus 1 is stopped and ends.

As described above, according to the substrate processing apparatus 1 of this embodiment, even when zero-point deviation occurs in the chemical differential pressure flowmeter 11 of the chemical flow rate controller 10 and/or the pure water differential pressure flowmeter 21 of the pure water flow rate controller 20, it is possible to regulate (correct) the flow rate of the chemical C and/or the pure water D while continuing to supply the mixed liquid M to the cleaning machine 40, and to maintain the mixed liquid M to be supplied to the cleaning machine 40 with the conforming concentration and the conforming flow rate. The flow rate of the chemical C and the flow rate of the pure water D in the mixed liquid M are calculated from the measured flow rate and the measured concentration, and the flow rate set value is corrected according to the difference between the calculated flow rate and the flow rate set value. For this reason, even if the concentration and/or the flow rate of the mixed liquid M is deviated from the conforming concentration or the conforming flow rate, it is possible to promptly return the concentration or the flow rate of the mixed liquid M to the conforming concentration or the conforming flow rate.

In this embodiment, the flow rate of the chemical C and the flow rate of the pure water D in the mixed liquid M are calculated from the measured flow rate and the measured concentration, and the flow rate set values are corrected based on the calculated values. For this reason, in this embodiment, the controller 60 is a controller as a command device which gives a command on the flow rate set values of the chemical flow rate controller 10 and the pure water flow rate controller 20, and the chemical flow rate controller 10 and the pure water flow rate controller 20 function as a device which performs substantial control. Accordingly, it is possible to exclude collision of controls, and stable control is possible. In this embodiment, it is possible to perform the correction of the flow rate set values at a predetermined time interval. Since zero-point deviation due to secular change in the chemical differential pressure flowmeter 11 and the pure water differential pressure flowmeter 21 does not occur in a short time, the predetermined time interval may be, for example, a day or a month. For example, when the predetermined time interval is one second, it is possible to handle zero-point deviation due to factors other than secular change. When the correction of the flow rate set values is performed at a predetermined time interval, in the flow of FIG. 2, the step of performing determination about whether or not both the compared two items substantially match each other (S5) may be performed at a predetermined time interval. In this case, the step of performing determination about whether or not the cleaning of the substrate W ends (S10) may be performed before the step of performing determination about whether or not both the compared two items substantially match each other (S5), determination about whether or not the predetermined time has elapsed may be performed when the cleaning does not end in the step of performing determination about whether or not the cleaning of the substrate W ends, the process may return to the step of performing determination about whether or not the cleaning of the substrate W ends when the predetermined time has not elapsed, and the process may progress to the step of performing determination about whether or not both the compared two items substantially match each other when the predetermined time has elapsed.

In the above-description, although the flow rate of the chemical C and the flow rate of the pure water D in the mixed liquid M are calculated from the measured flow rate and the measured concentration, the chemical flow rate controller 10 and/or the pure water flow rate controller 20 may be controlled based on the measured flow rate and the measured concentration without performing this kind of calculation. As an example, the following control is performed. It is assumed that the controller 60 controls two variates of the flow rate and concentration of the mixed liquid M. First, the controller 60, as the flow rate control of the mixed liquid M, regulates the set values of the chemical flow rate controller 10 and the pure water flow rate controller 20 in the same direction whichever increase or decrease such that the measured flow rate of the mixed liquid M becomes the conforming flow rate. Next, the controller 60, as the concentration control of the mixed liquid M, regulates the set values of the chemical flow rate controller 10 and the pure water flow rate controller 20 in the opposite direction, increase or decrease, such that the measured concentration of the mixed liquid M becomes the conforming concentration. At this time, the width of the increase/decrease may be determined according to the set values of the chemical flow rate controller 10 and the pure water flow rate controller 20. For example, when the flow rate set value of the chemical C is 10 and the flow rate set value of the pure water D is 90, the conforming flow rate of the mixed liquid M should be 100, but it is assumed that the measured flow rate is 110. In this case, both the flow rate set values of the chemical C and the pure water D are supposed to be changed in the decrease direction, and the flow rate set value of the chemical C is decreased by 1 and the flow rate set value of the pure water D is decreased by 9, instead of decreasing both the flow rate set values by the same amount of 5. Then, it is possible to suppress the variation width of the set value in the concentration control which is performed later. For example, while the flow rate of the mixed liquid M is different from the conforming flow rate, when the concentration is the conforming concentration, the flow rate set values in the concentration control do not have to be substantially varied. In this kind of control, the controller 60 is a so-called cascade controller which regulates the set values of the chemical flow rate controller 10 and the pure water flow rate controller 20 to control the flow rate and the concentration of the mixed liquid M through the chemical flow rate controller 10 and the pure water flow rate controller 20. The flow rates of the chemical C and the pure water D are separately controlled by the chemical flow rate controller 10 and the pure water flow rate controller 20 respectively. For this reason, stable control is possible. As described above, the flow rate and concentration of the mixed liquid M are regulated separately, whereby, when the conforming flow rate is constant, it is possible to set the measured concentration to the conforming concentration while maintaining the measured flow rate constant. That is, it is possible to make the measured flow rate constant even if the measured concentration is corrected. The above-described example is an example of control in which the regulation of the flow rate (of the concentration and flow rate of the mixed liquid M) is given priority, and when the regulation of the concentration is given priority, the concentration control may be performed earlier than the flow rate control. At this time, the width of the increase/decrease in the flow rate of the chemical C and the flow rate of the pure water D may also be determined to be 1:9 and the like according to the set values of the chemical flow rate controller 10 and the pure water flow rate controller 20. With this kind of control, it is possible to prevent collision of controls of two (chemical and pure water) variates. In this way, when the flow rate of the chemical C and the flow rate of the pure water D in the mixed liquid M are not calculated from the measured flow rate and the measured concentration, control can be simplified.

In the above description, although the concentration and the flow rate of the mixed liquid M are measured, the concentration may be measured and the flow rate may not be measured. The reason is as follows. When the concentration of the mixed liquid M is deviated from the conforming concentration, the concentration of the mixed liquid M which is excessively greater or excessively less than the conforming concentration may adversely affect the substrate W; however, even if the flow rate of the mixed liquid M is greater than the conforming flow rate, the flow rate of the mixed liquid M less adversely affects the substrate W.

Figure 3:
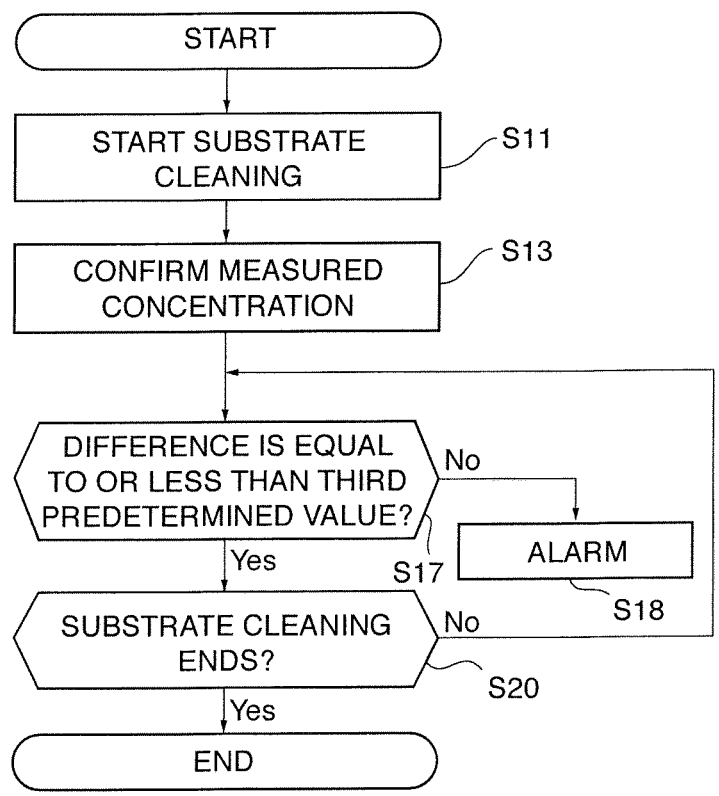
FIG. 3 is a flowchart showing control of the concentration of a mixed liquid in the substrate processing apparatus according to the embodiment of the present invention.

FIG. 3 is a flowchart of concentration control of the mixed liquid M when the concentration of the mixed liquid M is measured and the flow rate of the mixed liquid D is not measured. Even when the flow rate of the mixed liquid M is not measured, if the chemical C and the pure water D are supplied to the substrate processing apparatus, the mixed liquid M is generated, and the cleaning of the substrate W in the cleaning machine 40 starts (S11). When the mixed liquid M is supplied to the cleaning machine 40, the controller 60 receives the signal of the measured concentration from the mixed liquid concentration meter 51 (S13). Next, the controller 60 performs determination about whether or not the difference between the measured concentration and the conforming concentration is equal to or less than a third predetermined value (S17). The third predetermined value is an upper limit value which is appropriately determined within a range without adversely affecting the cleaning of the substrate W, and may be determined to, for example, 10% of the conforming concentration.

In the step of performing determination about whether or not the difference between the measured concentration and the conforming concentration is equal to or less than the third predetermined value (S17), when the difference exceeds the third predetermined value, the alarm is operated to attract attention (S18), whereby it becomes possible to promptly stop the cleaning of the substrate W in the cleaning machine 40. On the other hand, when the difference is equal to or less than the third predetermined value, the controller 60 performs determination about whether or not the cleaning of the substrate W ends (S20). When the cleaning of the substrate W does not end, the process returns again to the step of performing determination about whether or not the difference between the measured concentration and the conforming concentration is equal to or less than the third predetermined value (S17). In this way, the concentration of the mixed liquid M will be maintained to a value suitable for cleaning until the cleaning of the substrate W ends. On the other hand, in the step of performing determination about whether or not the cleaning of the substrate W ends (S20), when the cleaning of the substrate W ends, the supply of the chemical C and the pure water D to the substrate processing apparatus is stopped and ends.

In the control shown in the flowchart of FIG. 3, although, when the difference between the measured concentration and the conforming concentration is equal to or less than the third predetermined value (Yes in Step S17), the process progresses to the step of performing determination about whether or not the cleaning of the substrate W ends (S20), before the process progresses to the step of performing determination about whether or not the cleaning of the substrate W ends (S20), correction for making the measured concentration closer to the conforming concentration may be performed. As an example of this kind of correction, it is possible to control the concentration by changing the flow rate set value of each of the chemical flow rate controller 10 and the pure water flow rate controller 20 upward and downward such that the measured concentration becomes the conforming concentration. For example, when the measured concentration is higher than the conforming concentration, the controller 60 lowers the flow rate set value of the chemical flow rate controller 10 and raises the flow rate set value of the pure water flow rate controller 20. Then, the flow rates of the chemical C and the pure water D are controlled by the separate flow rate regulators, and the set values of the flow rates are in a cascade control controlled by the controller 60. For this reason, stable control is possible. This embodiment may be regarded as control when there is no difference between the measured flow rate and the conforming flow rate in the embodiment described referring to FIG. 2. Accordingly, the width of an increase/decrease in the flow rate set value for concentration control may be determined according to the set values of the chemical flow rate controller 10 and the pure water flow rate controller 20. According to the embodiment, even if deviation occurs in the measured values of the chemical differential pressure flowmeter 11 and the pure water differential pressure flowmeter 21 with respect to the actual flow rate, it is possible to prevent the deviation from affecting the final concentration control. In order to avoid a situation in which the flow rate of the mixed liquid M is less than the conforming flow rate, when varying the flow rate set value of the chemical flow rate controller 10 or the pure water flow rate controller 20 during the concentration control of the mixed liquid M, even if a calculated total flow rate exceeds the conforming flow rate, varying the flow rate set value in a direction of being not less than the original flow rate set value may be allowed.

As described above, if the concentration is measured and the flow rate is not measured, the mixed liquid flowmeter 52 may not be provided, whereby it is possible to eliminate control relating to the measured flow rate, to simplify the apparatus configuration, and to reduce control burden.

In the above description, although the first liquid is the chemical C and the second liquid is the pure water D, different types of liquids may be used. That is, liquids conforming to processing may be selected according to the processing content of the substrate W.

In the above description, although the differential pressure flowmeters 11 and 21, the mixed liquid concentration meter 51, and the mixed liquid flowmeter 52 output the flow rate or the concentration as the mass flow rate or the mass concentration since the concentration of the chemical is regulated, the flow rate or the concentration may be output as a volume flow rate or a volume concentration depending on the purpose.

In the above description, although the flow rate regulator is a flow rate controller, the flow rate regulator may be constituted by a combination of a constant pressure valve, a differential pressure flowmeter, and an orifice. That is, the flow rate regulator may be constituted as a unit, or may be constituted by separately preparing and arranging the devices disclosed herein.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

DESCRIPTION OF REFERENCE NUMERALS AND SYMBOLS 1 substrate processing apparatus
10 chemical flow rate controller
11 chemical differential pressure flowmeter
12 chemical flow rate regulation valve
20 pure water flow rate controller
21 pure water differential pressure flowmeter
22 pure water flow rate regulation valve
31 chemical supply pipe
32 pure water supply pipe
33 mixed liquid pipe
40 cleaning machine
51 mixed liquid concentration meter
52 mixed liquid flowmeter
60 controller
C chemical
D pure water
M mixed liquid
W substrate

What is claimed is:

1. A substrate processing apparatus comprising:
a substrate processing unit configured to process a substrate by supplying a mixed liquid to the substrate, the mixed liquid being a liquid with a mixture of a first liquid and a second liquid, the second liquid being of a type different from the first liquid;
a first supply pipe configured to allow the first liquid to flow therethrough;
a first flow rate regulator disposed in the first supply pipe, the first flow rate regulator having a first flow rate measurement unit and a first flow rate regulation unit, the first flow rate measurement unit being configured to measure a flow rate of the first liquid by a differential pressure, the first flow rate regulation unit being configured to regulate the flow rate of the first liquid;
a second supply pipe configured to allow the second liquid to flow therethrough;
a second flow rate regulator disposed in the second supply pipe, the second flow rate regulator having a second flow rate measurement unit and a second flow rate regulation unit, the second flow rate measurement unit being configured to measure a flow rate of the second liquid by a differential pressure, the second flow rate regulation unit being configured to regulate the flow rate of the second liquid;
a mixed liquid pipe configured to guide the mixed liquid to the substrate processing unit, the mixed liquid being a liquid with a mixture of the first liquid having passed through the first flow rate regulator and the second liquid having passed through the second flow rate regulator;
a concentration meter disposed in the mixed liquid pipe, the concentration meter being configured to measure a concentration of the first liquid in the mixed liquid; and
a controller configured to take difference elimination measures when the difference between a conforming concentration and a concentration measured with the concentration meter exceeds a predetermined value, the conforming concentration being a concentration of the mixed liquid suitable for processing the substrate in the substrate processing unit.

2. The substrate processing apparatus according to claim 1, further comprising:
a flowmeter disposed in the mixed liquid pipe, the flowmeter being configured to measure a flow rate of the mixed liquid,
wherein the controller regulates the flow rate of the first liquid passing through the first flow rate regulator and the flow rate of the second liquid passing through the second flow rate regulator such that the flow rate of the mixed liquid measured with the flowmeter becomes a flow rate suitable for processing the substrate in the substrate processing unit.

3. The substrate processing apparatus according to claim 1, the controller being configured to calculate a flow rate set value of the first flow rate regulator and a flow rate set value of the second flow rate regulator such that the mixed liquid has the conforming concentration, and the controller being configured to control the first flow rate regulation unit and the second flow rate regulation unit such that the flow rate measured with the first flow rate measurement unit becomes the flow rate set value of the first flow rate regulator and the flow rate measured with the second flow rate measurement unit becomes the flow rate set value of the second flow rate regulator.

4. The substrate processing apparatus according to claim 3, further comprising:
a flowmeter disposed in the mixed liquid pipe, the flowmeter being configured to measure a flow rate of the mixed liquid,
the controller being configured to calculate a calculated first liquid flow rate and a calculated second liquid flow rate based on the concentration measured with the concentration meter and the flow rate measured with the flowmeter, wherein the calculated first liquid flow rate is the flow rate of the first liquid in the mixed liquid and the calculated second liquid flow rate is the flow rate of the second liquid in the mixed liquid.

5. The substrate processing apparatus according to claim 4, the controller being configured to operate an alarm as the difference elimination measures when at least one difference of a first difference between the flow rate set value of the first flow rate regulator and the calculated first liquid flow rate or a second difference between the flow rate set value of the second flow rate regulator and the calculated second liquid flow rate exceeds a predetermined flow rate under a condition that the difference between the conforming concentration and the concentration measured with the concentration meter exceeds the predetermined value.

6. The substrate processing apparatus according to claim 4, the controller being configured to correct the flow rate set value of the first flow rate regulator by the difference between the flow rate set value of the first flow rate regulator and the calculated first liquid flow rate and to correct the flow rate set value of the second flow rate regulator by the difference between the flow rate set value of the second flow rate regulator and the calculated second liquid flow rate as the difference elimination measures.

7. The substrate processing apparatus according to claim 6, the controller being configured to take the difference elimination measures when both the difference between the flow rate set value of the first flow rate regulator and the calculated first liquid flow rate and the difference between the flow rate set value of the second flow rate regulator and the calculated second liquid flow rate are equal to or less than a predetermined flow rate under a condition that the difference between the conforming concentration and the concentration measured with the concentration meter exceeds the predetermined value.

8. The substrate processing apparatus according to claim 1, wherein the first liquid is chemical and the second liquid is pure water.

9. The substrate processing apparatus according to claim 1, further comprising:
a flowmeter disposed in the mixed liquid pipe, the flowmeter being configured to measure a flow rate of the mixed liquid,
the controller being configured to regulate the flow rate set value of the first flow rate regulator and the flow rate set value of the second flow rate regulator in the same direction such that the flow rate of the mixed liquid measured with the flowmeter becomes a conforming flow rate, wherein the conforming flow rate is a flow rate of the mixed liquid suitable for processing the substrate in the substrate processing unit, and then to regulate the flow rate set value of the first flow rate regulator and the flow rate set value of the second flow rate regulator in opposite directions such that the concentration of the mixed liquid measured with the concentration meter becomes the conforming concentration, as the difference elimination measures.

10. The substrate processing apparatus according to claim 1, further comprising:
a flowmeter disposed in the mixed liquid pipe, the flowmeter being configured to measure a flow rate of the mixed liquid,
the controller being configured to regulate the flow rate set value of the first flow rate regulator and the flow rate set value of the second flow rate regulator in opposite directions such that the concentration of the mixed liquid measured with the concentration meter becomes the conforming concentration, and then to regulate the flow rate set value of the first flow rate regulator and the flow rate set value of the second flow rate regulator in the same direction such that the flow rate of the mixed liquid measured with the flowmeter becomes a conforming flow rate, wherein the conforming flow rate is a flow rate of the mixed liquid suitable for processing the substrate in the substrate processing unit, as the difference elimination measures.

* * * * *